(12) United States Patent
Badrieh

(10) Patent No.: US 11,775,199 B2
(45) Date of Patent: Oct. 3, 2023

(54) VOLTAGE RESONANCE MITIGATION OF MEMORY DIES

(71) Applicant: Micron Technology, Inc., Boise, ID (US)

(72) Inventor: Fuad Badrieh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 17/153,519

(22) Filed: Jan. 20, 2021

(65) Prior Publication Data

US 2022/0229579 A1   Jul. 21, 2022

(51) Int. Cl.
   *G11C 11/4074*   (2006.01)
   *G06F 3/06*   (2006.01)
   *G11C 5/14*   (2006.01)
   *G11C 11/22*   (2006.01)
   *G11C 16/22*   (2006.01)

(52) U.S. Cl.
   CPC .......... *G06F 3/0653* (2013.01); *G06F 3/0625* (2013.01); *G06F 3/0679* (2013.01); *G11C 5/143* (2013.01); *G11C 11/225* (2013.01); *G11C 16/225* (2013.01)

(58) Field of Classification Search
   CPC ...................................................... G11C 5/143
   See application file for complete search history.

(56) References Cited

U.S. PATENT DOCUMENTS

| | | | | |
|---|---|---|---|---|
| 5,959,512 A | * | 9/1999 | Sherman | H01P 1/219 333/210 |
| 2012/0164966 A1 | * | 6/2012 | Casagrande | H04L 27/14 455/318 |
| 2014/0244947 A1 | * | 8/2014 | Song | G06F 13/1694 711/154 |
| 2015/0089315 A1 | * | 3/2015 | Alcocer Ochoa | H04L 25/022 714/746 |
| 2017/0365445 A1 | * | 12/2017 | Kubota | H01J 37/32715 |
| 2020/0310521 A1 | * | 10/2020 | Badrieh | G06F 1/3275 |

\* cited by examiner

*Primary Examiner* — Min Huang
(74) *Attorney, Agent, or Firm* — Holland & Hart LLP

(57) ABSTRACT

A voltage of a conductive line, such as a control line, a data line, or a voltage supply line associated with a memory die may be monitored. A frequency response of the voltage may be analyzed to determine if the conductive line may be operating at or near a specific frequency, such as a resonance frequency. If the conductive line is operating at or near the specific frequency, an action, such as a memory operation, may be performed to mitigate the resonance of the conductive line. The monitoring, analyzing, and action performing may be accomplished with circuitry of the memory die.

22 Claims, 6 Drawing Sheets

VOLTAGE RESONANCE MITIGATION OF MEMORY DIES

FIELD OF TECHNOLOGY

The following relates generally to one or more systems for memory and more specifically to voltage resonance mitigation of memory dies.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
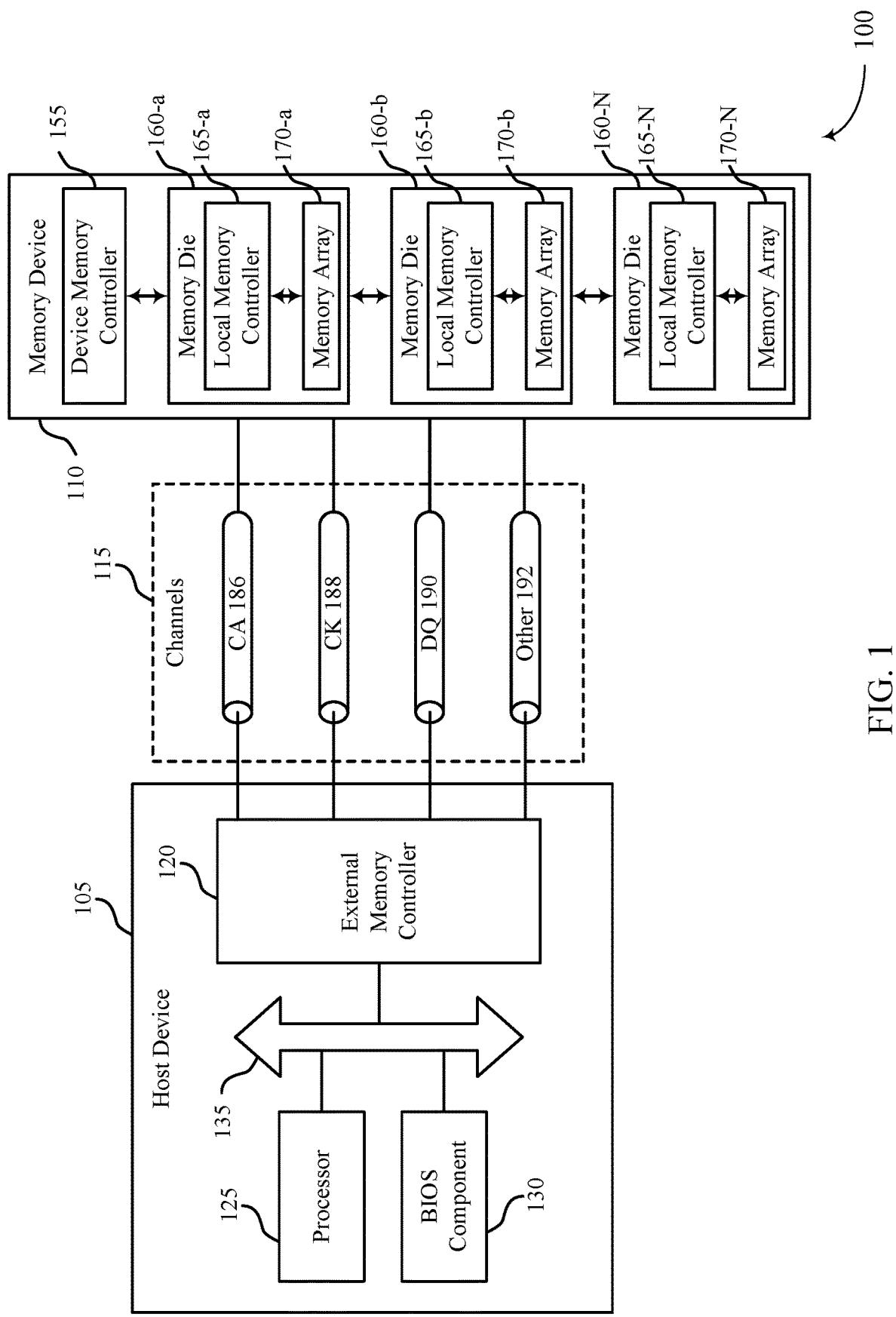
FIG. 1 illustrates an example of a system that supports voltage resonance mitigation of memory dies in accordance with examples as disclosed herein.

A power delivery network may provide power to a memory device. In doing so, the power delivery network may be susceptible to different factors including feedback, time dependence, frequency dependence, and so forth, due to various circuit elements and other elements. Additionally, memory devices may draw current from a supply line of the power delivery network when executing commands received from a host device. In some examples, the current demand may cause the voltages of the supply line to oscillate at or around one or more resonant frequencies. When a supply line of the power delivery network operates close to or at a resonance frequency, the memory device may perform sub-optimally due to unstable voltage fluctuations on the supply line.

Some memory devices may include one or more elements (e.g., a DRAM transistor), which may each have an impedance associated with it. The impedance may be frequency dependent, and frequency dependent elements may behave differently for different time stimulus. In some examples, a high impedance at or around a frequency or range of frequencies may cause undesirable oscillating patterns or a resonance frequency, which may cause different parameters (e.g., voltage) to become unstable.

For these and other reasons, it may be desirable to keep the impedance of a conductive line of a memory die, such as a power supply line or a signal or control line, away from the resonance frequency. Systems, techniques and devices are described herein that may determine when a conductive line signal is at or close to the resonance frequency and may implement one or more mitigation operations to reduce a likelihood of oscillations occurring. In some examples, the voltage response of the memory device may be monitored for unacceptable behavior (e.g., operating at or near a resonant frequency). After identifying this condition, an action may be performed so that the conditions may be mitigated.

In some cases, a conductive line, such as a control line, a data line, or a voltage supply line associated with a memory die may be monitored. A frequency response of the voltage may be analyzed to determine if the conductive line may be operating at or near a specific frequency, such as a resonance frequency. If the conductive line is operating at or near the specific frequency, an action, such as a memory operation, may be performed to mitigate the resonance of the conductive line. The monitoring, analyzing, and action performing may be accomplished with circuitry of the memory die.

Features of the disclosure are initially described in the context of systems and dies as described with reference to FIGS. 1 and 2. Features of the disclosure are further described in the context of impedance and voltage plots as described with reference to FIGS. 3-4. These and other features of the disclosure are further illustrated by and described with reference to an apparatus diagram and a flowchart that relate to voltage resonance mitigation of memory dies as described with reference to FIGS. 5-7.

FIG. 1 illustrates an example of a system 100 that supports voltage resonance mitigation of memory dies in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160. Portions of the present disclosure may be performed by the device memory controller 155. For example, the device memory controller 155 may monitor one or more of the memory dies 160 and cause the memory dies to perform mitigating actions when a voltage frequency is at or near a resonance frequency.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both. Portions of the present disclosure may be performed by the local memory controller 165. For example, the local memory controller 165 may monitor one or more voltages of the corresponding memory die 160 and cause the memory die to perform mitigating actions when a voltage frequency is at or near a resonance frequency. The local controller 165 may do this on its own or in conjunction with the device memory controller 155.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
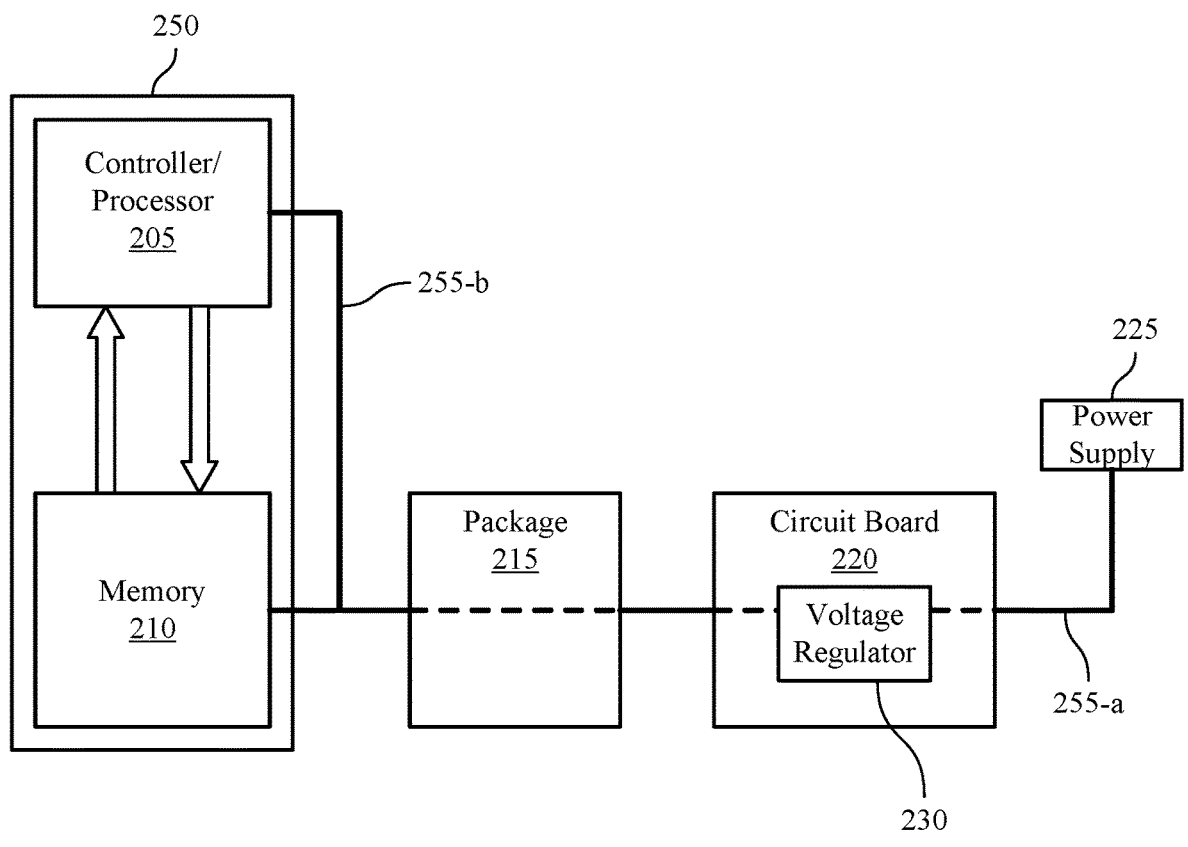
FIG. 2 illustrates an example of a memory system that supports voltage resonance mitigation of memory dies in accordance with examples as disclosed herein.

FIG. 2 illustrates an example of a memory system 200 that supports voltage resonance mitigation of memory dies in accordance with examples as disclosed herein. The system 200 may include a memory 210 (e.g., a DRAM) coupled with a controller/processor 205. Controller/processor 205 and memory 210 may be examples of local memory controller 165 and memory array 170, respectively, discussed with reference to FIG. 1. Controller/processor 205 and memory 210 may be co-located on a single memory die 250, which may be an example of memory die 160 discussed with reference to FIG. 1. In some examples, one or more of the operations discussed below (e.g., the features of the methods associated with FIG. 5 or FIG. 7 or both) may be performed for a memory die 250 at the controller/processor 205 associated with the memory die 250.

The memory die 160 may be positioned in a package 215 and the package 215 may be attached or otherwise coupled with a circuit board 220. The memory 210 and/or the controller/processor 205 may obtain operational power from a power supply 225 positioned on or near the circuit board 220. A power delivery network (e.g., power supply line 255) may be routed through the circuit board 220 and the package 215 to get to the memory 210 and processor 205. The power delivery network may include a voltage regulator 230 to regulate the signal passing through the power supply line 255. The voltage regulator 230 may receive power signals from power supply 225 over to power supply line 255-*a* and output regulated power signals over power supply line 255-*b* to memory 210 and controller/processor 205. The power supply lines 255-*a* and 255-*b* may have an overall impedance that may include portions associated with the circuit board 220, the package 215, the voltage regulator 230, and the memory die 210. The impedance portions may include resistance, capacitance, and inductance components from one or all of these components.

For example, capacitors associated with voltage regulator 230 may be located on the circuit board 220 to stabilize voltage and to hold such voltages associated with the voltage regulator steady. In some cases, the capacitors may have parasitics associated with them and the circuit board 220 may additionally have parasitics associated with it. Additionally, the package encapsulated memory die 250 may have impedance associated with it. There may be multiple memory dies 250 associated with a single package 215 and its corresponding power supply 225 and voltage regulator 230.

A conductive line may have various elements that cause higher impedances to occur at one or more frequencies (e.g., resonant frequencies). One way to reduce such circuit behavior may be to include more capacitors in the circuit. Additional capacitors may take up additional die area, which may not always be available to allocate to capacitors. Systems, devices, and techniques are described for reducing a likelihood that a memory die operates at a resonant frequency using a firmware or software solution implemented by the controller/processor 205 or by circuits on the memory 210 (or both).

Figure 3:
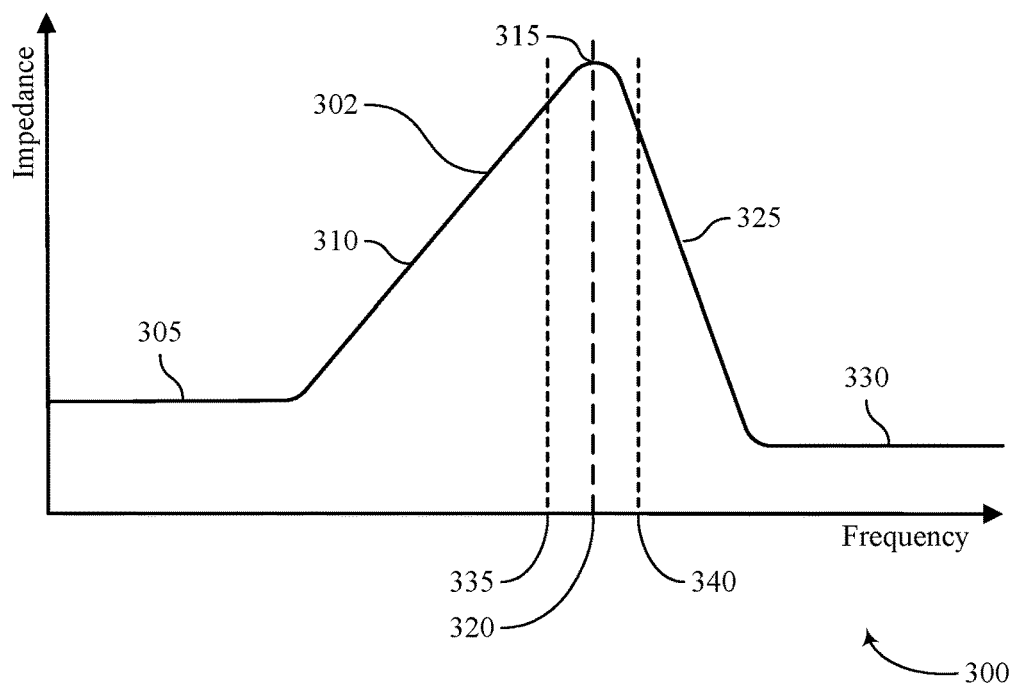
FIG. 3 illustrates an example of an impedance diagram that supports voltage resonance mitigation of memory dies in accordance with examples as disclosed herein.

FIG. 3 illustrates an example of an impedance diagram 300 that supports voltage resonance mitigation of memory dies in accordance with examples as disclosed herein. The diagram 300 may plot the impedance of a signal with respect to the signal's frequency. The diagram 300 may be an example of an impedance curve 302 of a conductive line (e.g., a power supply line, or a signal line, or a control line) of a memory die. For example, impedance curve 302 may correspond to a voltage supply line (e.g., supply line 255-*b*) from a voltage regulator (e.g., voltage regulator 230) to a memory die (e.g., memory die 250) and may illustrate the die side impedance.

A power supply line may be designed to reduce (or minimize) impedance for frequency independent impedance, and to maintain a steady state frequency such that the voltage drop between an ideal case and the memory die may be close to zero or a constant number. In some cases, for a physical power supply line, the impedance may be a function of frequency. Diagram 300 illustrates a simplified example of a frequency dependent behavior of impedance for a conductive line (e.g., a voltage supply line) of a memory die. The impedance curve 302 may be an example of an impedance curve 302 associated with a circuit; the inflection points, magnitude, and slope/rate may vary and may be dependent on the design of the circuit (e.g., the power delivery network circuit).

At lower frequencies (e.g., at 305), the impedance may mostly be due to the resistance R of the conductive line as a significant portion of the direct current demand on the line may be addressed. For example, in a power supply line, a voltage regulator may be able to address the direct current demand. As the frequency increases (e.g., at 310), the impedance curve may increase or go up, partially due to parasitic and inductive effects of circuit board capacitors, and also due to package inductance. At these frequencies, the impedance may be represented as sL, where s may be equal to $2\pi f$, where f may be the frequency and L may be the inductance. So at these frequencies the impedance of the circuit board and its capacitors may increase the impedance as a function of frequency.

As the frequency further increases, the impedance may reach a value (e.g., at 315) at a resonance frequency $f_0$ (e.g., at 320) and then decrease (e.g., at 325), due to capacitors, including on the memory die, that may address impedance in the higher frequencies (e.g., ranging around and above a range of tens to hundreds of MHz). At these frequencies, the impedance may be represented as $1/sC$, where s may be equal to $2\pi f$, and C may be the capacitance. So at these frequencies the impedance of the circuit board and its capacitors may decrease the impedance as a function of frequency. In practical applications, the capacitors may not be ideal capacitors, so there may be parasitic equivalent series resistance (ESR) and equivalent series inductance (ESL) associated with the capacitors at the highest frequencies (e.g., at 330). ESR and ESL may be typical parasitics associated with memory device circuits (e.g., power delivery network circuits).

Generally, an impedance at or near the resonance frequency may not be desirable as it may cause issues on the corresponding lines (e.g., unstable voltage fluctuations or timing problems). In the example of FIG. 3, it may be desirable to keep the frequency of the conductive line away from the resonance frequency $f_0$ (320) and/or around the resonance frequency (e.g., between the frequency range 335 to 340), which may, e.g., be in the approximate range of and around tens of MHz (e.g., 20 MHz) for a supply line voltage. In some cases, it may be desirable to reduce the value of the peak impedance (e.g., at 315) to mitigate adverse effects caused by operating at the resonant frequency.

In practice, the line signal may include multiple frequencies, with the line signal having different impedances at the different frequencies. In those cases, it may be desirable to reduce the strength of the portion of the line signal that is at or around the resonance frequency and/or move that portion away from the resonance frequency. In some cases, this may be done by determining a frequency spectrum of the line signal and then performing a mitigating action that moves the signal portion away from or around the resonance frequency. In some cases, there may be more than one resonance frequency corresponding to the line signal. In those cases, one or more mitigating actions may be performed to move the signal portions away from or around the resonance frequencies. The mitigating actions may be performed individually or together.

Figure 4:
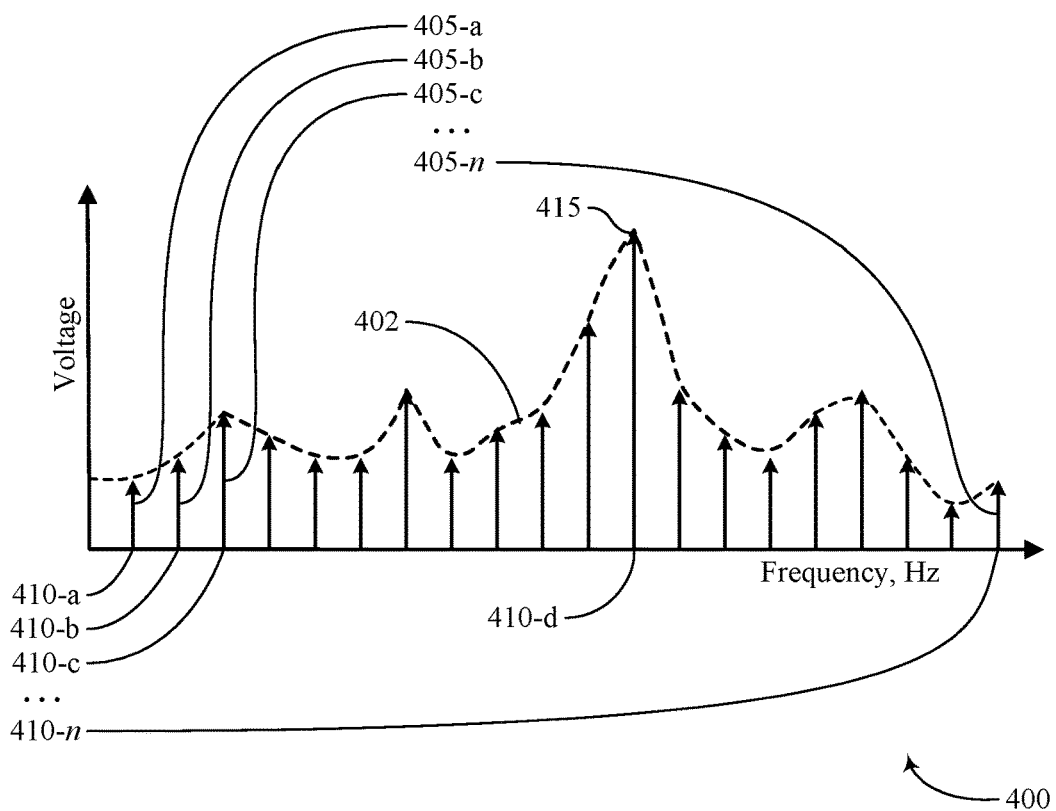
FIG. 4 illustrates an example of a voltage diagram that supports voltage resonance mitigation of memory dies in accordance with examples as disclosed herein.

FIG. 4 illustrates an example of a voltage diagram 400 that supports voltage resonance mitigation of memory dies in accordance with examples as disclosed herein. The diagram 400 may be an example of a voltage curve 402 of a conductive line of a memory die (e.g., a supply line, or a signal line, or a control line) with respect to frequency. For example, voltage curve 402 may correspond to a voltage supply line from a voltage regulator to the memory die. The voltage curve 402 may show a frequency response and represent a frequency spectrum of the voltage of the conductive line. Based on the frequency response, a resonance frequency may be detected in the signal so that a corrective action may mitigate unwanted issues from occurring.

In some examples, the frequency response of a voltage signal may be determined by performing a spectral analysis of the signal. In some examples, a sensing element or sensor may sense an on-die voltage and the spectrum of the signal may be dynamically calculated on the fly (e.g., in or close to real-time). In some examples, the sensor may be located on the memory die to monitor an on-die voltage. In some examples, an on-die oscilloscope capable of reading transient waveforms may provide frequency spectrum information.

In some examples, the composition of the voltage signal may be determined at a plurality of finite frequencies. For example, in FIG. 4, the compositions 405 (e.g., 405-*a* through 405-*n*) may be respectively determined at frequencies 410 (e.g., 410-*a* through 410-*n*). In some examples, the frequency response may be determined and analyzed by taking a Fourier Transform of the signal to identify patterns and to identify peaks in the spectrum. As the voltage oscillates, peaks in the spectrum may indicate that the voltage is at or near the resonance frequency. By identifying the pattern and/or spectrum peaks, issues caused by the resonance may be mitigated by performing a corrective action.

The frequency response of the signal may be analyzed with respect to the resonance frequency to determine when a mitigation operation may be performed. In some examples, a lookup table (e.g., a predetermined lookup table) may be utilized to identify and compare the calculated spectrum with the spectrum (e.g., the resonance frequency). In some examples, the resonance frequency may be determined empirically.

In some examples, peaks in the spectrum may be compared to the resonance frequency to determine if a mitigating action may be performed. For example, in FIG. 4, a large peak 415 may occur at frequency 410-*d*. If frequency 410-*d* is the resonance frequency (e.g., frequency 320 of FIG. 3) or near the resonance frequency (e.g., between frequencies 335 and 340 of FIG. 3) of the conductive line, an action may be performed to mitigate the resonance of the monitored voltage.

In some examples, a corrective action may be desired if the value of the voltage at or near the resonance frequency satisfies a threshold. In some examples, a corrective action may be desired if the value of the voltage at or near the resonance frequency is greater than the value of a second voltage at a second frequency by at least a voltage offset. In some examples, a corrective action may be desired if the value of the voltage at or near the resonance frequency is greater than an average value of a voltage over a set of frequencies by at least a voltage offset.

In some examples, if the spectrum has some quantity of tones (e.g., a minimum quantity) in a region or if a tone may exceed a value (e.g., a predetermined value), then a corrective action may be performed to mitigate issues before they occur.

In some examples, the corrective action may include delaying a start time of an access operation in a queue of the memory die or even refraining from performing the access operation. In some examples, the corrective action may include temporarily reducing power consumption, stretching a current pattern, or altering a supply voltage used by the memory die (e.g., by changing the voltage level). In some examples, the corrective action may include signaling or transmitting an indication of the resonance to a host device. For example, the indication may include an indication that the resonance occurred, or the frequency at which the monitored voltage resonated, or the operation performed to mitigate the resonance, or any combination thereof. In some examples, more than one corrective action may be performed. For example, any combination of the above corrective actions may be performed.

Changes to the timing of operations at the memory device may reduce a likelihood that a resonance occurs in the circuit. Timing of access operations may affect the voltages at various frequencies based on oscillations in the voltage signal caused by applying currents. For example, if a current pulse is applied to a conductive line as part of an operation performed by the memory device, the current pulse may cause a response (or oscillations) in voltage signal on the conductive line. During an operation multiple current pulses may be applied to a conductive line. If a second current pulse is applied to the conductive line before the oscillations of the voltage signal associated with a first current pulse have subsided, the oscillations of the voltage signal associated with the second current pulse may combine with the oscillations of the voltage signal associated with eh first current pulse. In some cases, these oscillations may combine in a constructive manner and may cause a resonance to occur. By altering timing of various current pulses, the likelihood that a resonance occurs may be reduced or a resonance that is forming may be reduced. Thus, a controller/processor or other components associated with a memory may be configured to reduce likelihoods of operating at resonant frequencies by adjusting the timing of some operations. The adjustments to the operations (e.g., to the timing of the operations or to timing of sub-parts of the operations) being performed by memory may be examples of the corrective actions.

Figure 5:
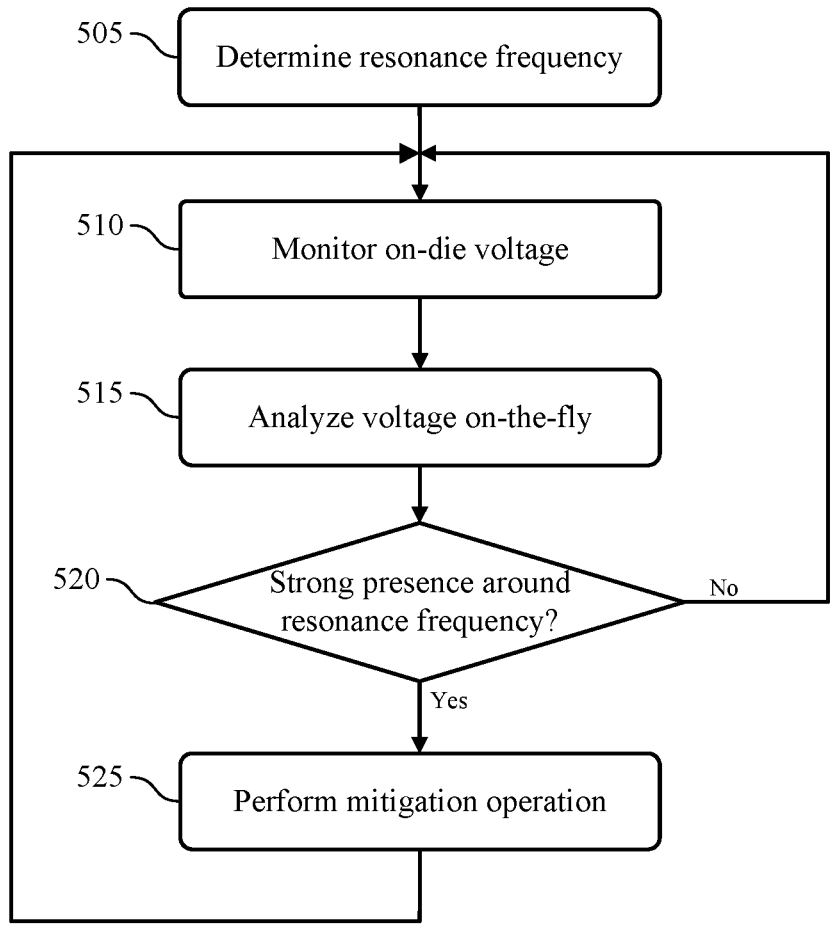
FIG. 5 shows a flowchart illustrating a method that supports voltage resonance mitigation of memory dies in accordance with examples as disclosed herein.

FIG. 5 shows a flowchart illustrating a method 500 that supports voltage resonance mitigation of memory dies in accordance with examples as disclosed herein. One or more of the operations of the method 500 may be performed by or at the memory die. For example, for a memory die 250, one or more of the operations may be performed by controller/processor 205 positioned on the memory die.

At 505, a resonance frequency associated with the memory die or a conductive line thereof (e.g., a voltage supply line) may be determined. In some examples, the resonance frequency may be determined by testing the memory die, e.g., when the die is manufactured. In some examples, the resonance frequency may be calculated by modeling the line. In some examples, a lookup table may be utilized to identify the resonance frequency of the line. By knowing the resonance frequency, the timing of various actions (e.g., memory access operations, command signaling from the host device) may be changed before the voltage of the conductive line reaches the resonance frequency. In some cases, the resonance frequency may already be known. In those cases, the features recited with reference to 505 may be omitted.

At 510, a voltage of a conductive line associated with the memory die (e.g., a voltage supply line) may be monitored. In some examples, the voltage may be monitored using a sensing element or a sensor which may be located on the memory die. In some examples, on on-die component (e.g., an oscilloscope) may be used to monitor transient waveforms of the conductive line. In some examples, the voltage may include a supply voltage of the memory die. In some cases, the voltage on the die is monitored in real time and that measured voltage may be used to build the frequency spectrum of the voltage signal. The more samples taken of the measured voltages signal, the more the frequency spectrum response may be refined. In some cases, the conversion from time domain to frequency one is the Fourier transform.

At 515, the monitored voltage may be analyzed. In some examples, the frequency response of the monitored voltage may be analyzed with respect to the resonance frequency. In some examples, the frequency spectrum of the monitored voltage may be analyzed. In some examples, an on-die oscilloscope capable of reading transient waveforms may provide the frequency spectrum information. In some examples, the monitored voltage may be analyzed with respect to its frequency components and the spectrum of the signal may be dynamically calculated on the fly (e.g., in or close to real-time). In some examples, peaks in the spectrum of the signal may be compared to the resonance frequency. In some examples, the frequency response may be determined and analyzed by taking a Fourier Transform of the monitored voltage to identify patterns and to identify peaks in the spectrum.

At 520, it may be determined whether the monitored voltage satisfies a condition indicating whether the monitored voltage has a strong presence at or around the resonance frequency. In some examples, the condition may be met if a value of the monitored voltage at or near the resonance frequency satisfies a threshold. In some examples, the condition may be met if the value of the voltage at or near the resonance frequency is greater than the value of a second voltage at a second frequency by at least a voltage offset. In some examples, the condition may be met if the value of the voltage at or near the resonance frequency is greater than an average value of a voltage over a set of frequencies by at least a voltage offset. In some examples, the determination of whether the condition is met may occur before the monitored voltage operates at the resonance frequency. The frequency spectrum response of the voltage may be compared to a reference.

In some cases, the frequency spectrum response of the voltage may be compared with one or more frequencies at which resonances may occur. If the sampled spectrum satisfies the conditions, then corrective action may be taken. If the sampled spectrum does not satisfy the thresholds or conditions, the memory die may continue operating as normal. In some examples, the reference frequencies, the thresholds, or the conditions that are compared with the measured voltage may have been obtained from simulations or measurements. The memory device may be configured to dynamically change or set a sample time, a spectrum resolution and a closeness criterion for the analysis parameters.

Additionally, in some examples, whether the voltage satisfies the condition may be determined by monitoring transient waveforms via on on-die component. The on-die component may be an oscilloscope and may provide frequency spectrum information for identifying the resonance frequency. In some examples, whether the voltage satisfies the condition may be determined by monitoring frequency spectrum information associated with the voltage using one or more transient waveforms. In some examples, the on-die component may provide frequency spectrum information for identifying the resonance frequency.

If a condition indicating that the monitored voltage has a strong presence at or around the resonance frequency is satisfied, the method may continue to 525 to perform a mitigating action. Otherwise, if a condition indicating that the monitored voltage has a strong presence at or around the resonance frequency is not satisfied, the method may return to 510 to continue monitoring the conductive line.

At 525, a mitigation action or operation may be performed. In some examples, the mitigation action may include delaying a start time of an access operation in a queue of the memory die. In some examples, the mitigation action may include abandoning (e.g., not performing) an access operation in a queue of the memory die. In some examples, the mitigation action may include temporarily reducing power consumption of the memory die. In some examples, the mitigation action may include stretching a current pattern used by the memory die. An example of stretching a current pattern may include increase one or more durations between applying one or more current pulses in the memory array. In some examples, the mitigation action may include altering (e.g., changing a voltage level of) a supply voltage used by the memory die. In some examples, the mitigation action may include signaling or transmitting an indication from the memory device to the host device. The indication may include the frequency at which the monitored voltage resonated, or the operation performed to mitigate the resonance or a combination thereof.

At 525, the timing of at least one command associated with the memory device and/or memory die, may be adjusted at the memory die by the host device or memory die. The timing of the command may be different than a previous timing associated with the command that may have caused a current demand that may have caused undesirable voltage oscillations. In contrast, the new timing may mitigate current demands or voltage oscillations.

In some examples, the mitigating operation may be performed so that the monitored signal may operate at the resonance frequency for a short period of time before the corrective action may be performed.

When the mitigation operation is completed, the method may return to 510 to continue monitoring the conductive line. In this manner, voltage of the conductive line may be continuously monitored and analyzed to determine if and when to perform a mitigation operation.

Method 500 has been discussed above with respect to systems having a single resonance frequency. Method 500 may also be adapted to be used with systems having more than one resonance frequency. For example, at 505, more than one resonance frequency may be determined; at 520, it may be determined whether the monitored voltage has a strong presence at or around each resonance frequency; and at 525, a mitigation operation may be performed corresponding to each resonance frequency. The resonance frequencies may be dealt with individually or together.

Figure 6:
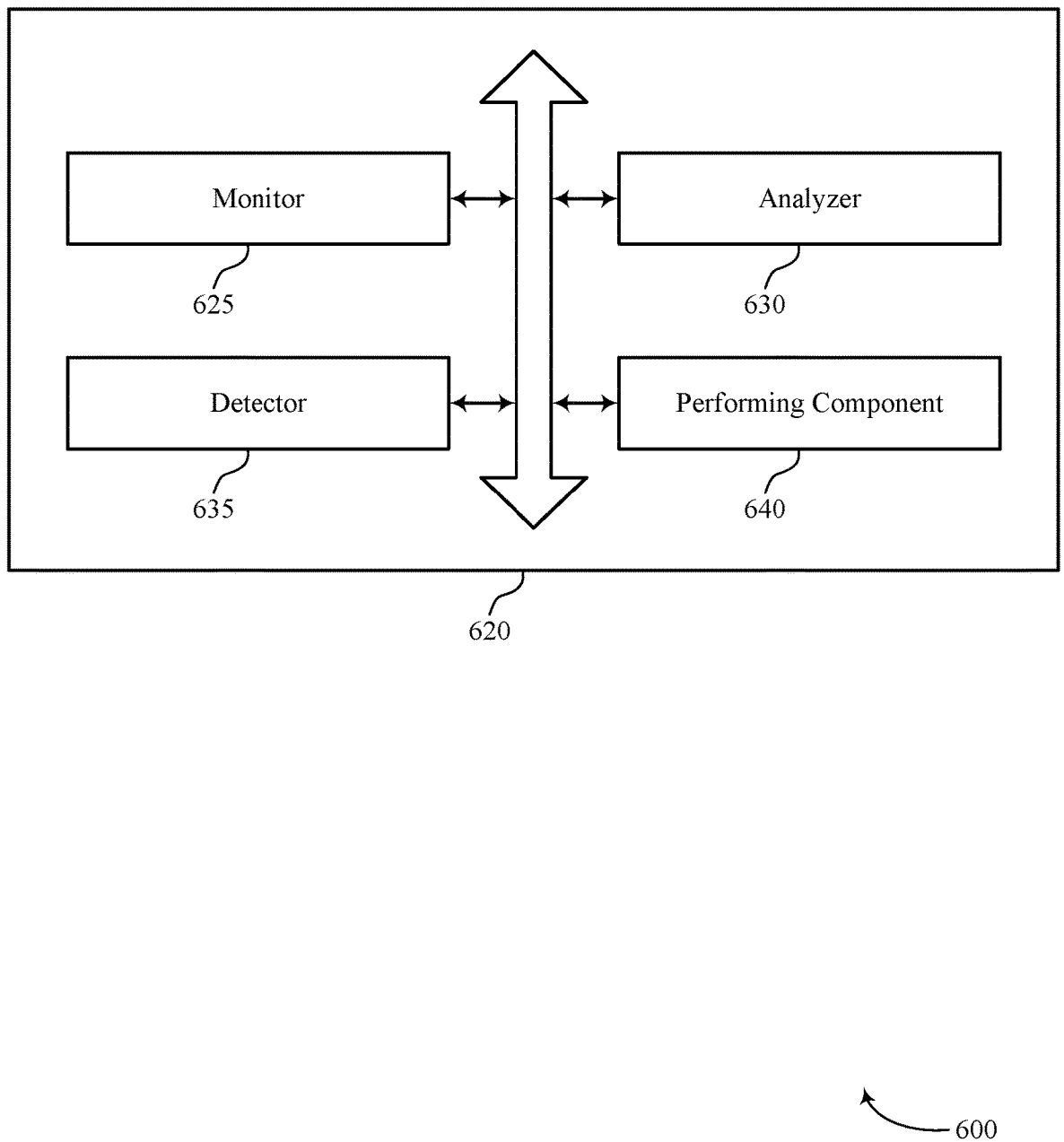
FIG. 6 shows a block diagram of a memory device that supports voltage resonance mitigation of memory dies in accordance with examples as disclosed herein.

FIG. 6 shows a block diagram 600 of a memory device 620 that supports voltage resonance mitigation of memory dies in accordance with examples as disclosed herein. The memory device 620 may be an example of aspects of a memory device as described with reference to FIGS. 1 through 5. The memory device 620, or various components thereof, may be an example of means for performing various aspects of voltage resonance mitigation of memory dies as described herein. For example, the memory device 620 may include a monitor 625, an analyzer 630, a detector 635, a performing component 640, or any combination thereof. Each of these components may communicate, directly or indirectly, with one another (e.g., via one or more buses).

The monitor 625 may be configured as or otherwise support a means for monitoring a voltage of a memory die. The analyzer 630 may be configured as or otherwise support a means for analyzing, with circuitry of the memory die, a frequency response of the monitored voltage. The detector 635 may be configured as or otherwise support a means for detecting, with the circuitry of the memory die, a frequency at which the monitored voltage resonates. The performing component 640 may be configured as or otherwise support a means for performing, with the circuitry of the memory die, an operation to mitigate the resonance of the monitored voltage at the frequency. In some examples, the voltage includes a supply voltage of the memory die.

In some examples, the detector 635 may be configured as or otherwise support a means for detecting that a first value of the voltage at the frequency is greater than a second value of the voltage at a second frequency plus a voltage offset. In some examples, the detector 635 may be configured as or otherwise support a means for detecting that a value of the voltage at the frequency satisfies a threshold associated with the resonance. In some examples, the detector 635 may be configured as or otherwise support a means for detecting that a value of the voltage at the frequency is greater than an average value of the voltage over a set of frequencies plus a voltage offset.

In some examples, the detector 635 may be configured as or otherwise support a means for detecting a second time, with the circuitry of the memory die, the frequency at which the monitored voltage resonates. In some examples, the performing component 640 may be configured as or otherwise support a means for refraining from performing an access operation to mitigate the resonance of the monitored voltage the second time.

In some examples, the performing component 640 may be configured as or otherwise support a means for delaying a start time of an access operation in a queue of the memory die. In some examples, the performing component 640 may be configured as or otherwise support a means for altering a supply voltage used by the memory die.

In some examples, the performing component 640 may be configured as or otherwise support a means for transmitting an indication of the resonance to a host device. In some examples, the indication may include an indication that the resonance occurred, or the frequency at which the monitored voltage resonated, or the operation performed to mitigate the resonance.

In some examples, the analyzer 630 may be configured as or otherwise support a means for performing a spectral analysis of the monitored voltage. In some examples, the analyzer 630 may be configured as or otherwise support a means for analyzing the frequency response of the monitored voltage using a fourier transform.

In some examples, the monitor 625 may be configured as or otherwise support a means for monitoring a voltage of a memory die. In some examples, the analyzer 630 may be configured as or otherwise support a means for analyzing a frequency response of the monitored voltage. In some examples, the detector 635 may be configured as or otherwise support a means for detecting a frequency at which the monitored voltage resonates. In some examples, the performing component 640 may be configured as or otherwise support a means for performing an operation to mitigate the resonance of the monitored voltage.

In some examples, the detector 635 may be configured as or otherwise support a means for detecting a second time the frequency at which the monitored voltage resonates. In some examples, the performing component 640 may be configured as or otherwise support a means for refraining from performing an access operation using the memory die.

Figure 7:
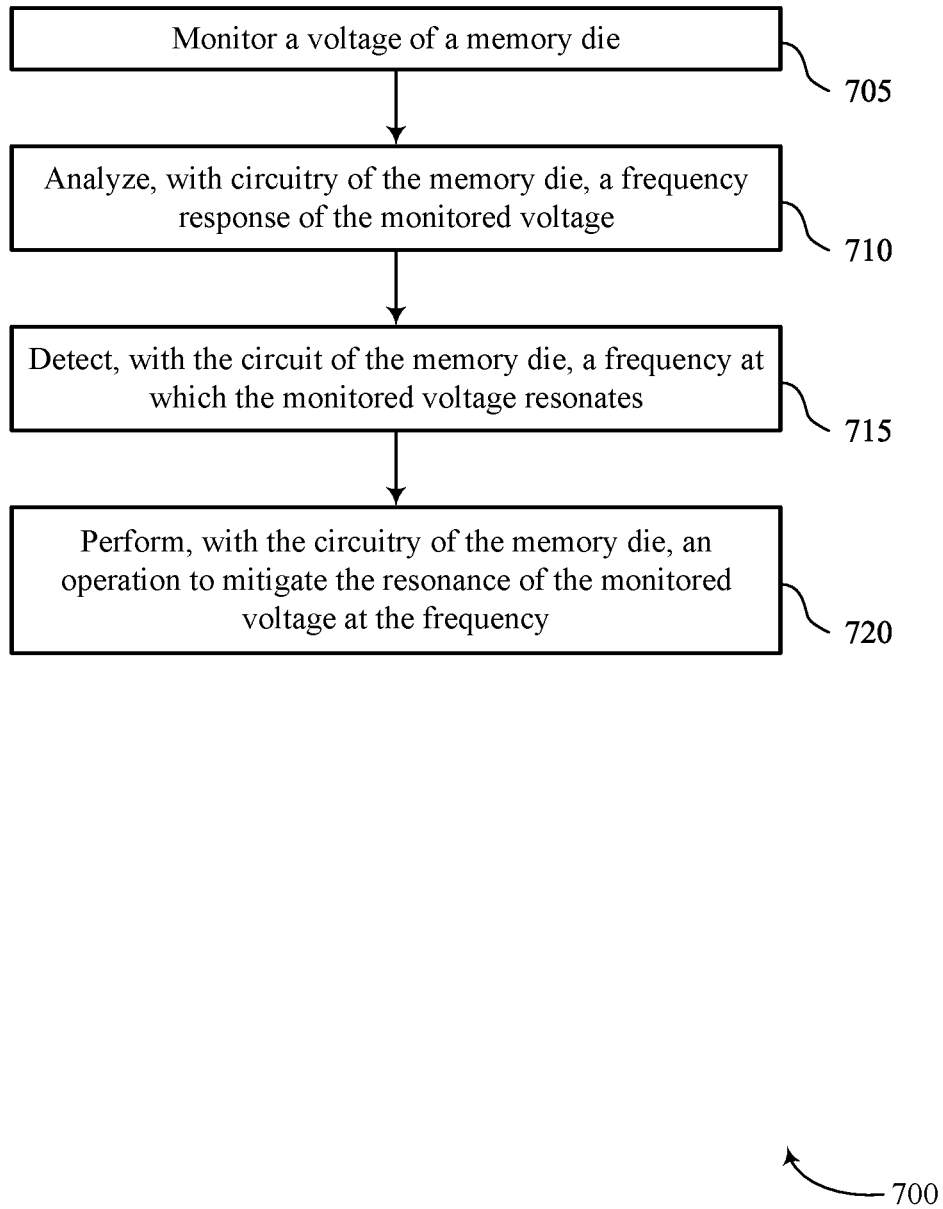
FIG. 7 shows a flowchart illustrating a method that supports voltage resonance mitigation of memory dies in accordance with examples as disclosed herein.

FIG. 7 shows a flowchart illustrating a method 700 that supports voltage resonance mitigation of memory dies in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include monitoring a voltage of a memory die. The operations of 705 may be performed in accordance with examples as disclosed herein. In some examples, aspects of the operations of 705 may be performed by a monitor 625 as described with reference to FIG. 6.

At 710, the method may include analyzing, with circuitry of the memory die, a frequency response of the monitored voltage. The operations of 710 may be performed in accordance with examples as disclosed herein. In some examples, aspects of the operations of 710 may be performed by an analyzer 630 as described with reference to FIG. 6.

At 715, the method may include detecting, with the circuitry of the memory die, a frequency at which the monitored voltage resonates. The operations of 715 may be performed in accordance with examples as disclosed herein. In some examples, aspects of the operations of 715 may be performed by a detector 635 as described with reference to FIG. 6.

At 720, the method may include performing, with the circuitry of the memory die, an operation to mitigate the resonance of the monitored voltage at the frequency. The operations of 720 may be performed in accordance with examples as disclosed herein. In some examples, aspects of the operations of 720 may be performed by a performing component 640 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for monitoring a voltage of a memory die, analyzing, with circuitry of the memory die, a frequency response of the monitored voltage, detecting, with the circuitry of the memory die, a frequency at which the monitored voltage resonates, and performing, with the circuitry of the memory die, an operation to mitigate the resonance of the monitored voltage at the frequency.

In some examples of the method 700 and the apparatus described herein, the voltage includes a supply voltage of the memory die.

Some examples of the method 700 and the apparatus described herein may further include operations, features, circuitry, logic, means, or instructions for detecting that a first value of the voltage at the frequency may be greater than a second value of the voltage at a second frequency plus a voltage offset.

Some examples of the method 700 and the apparatus described herein may further include operations, features, circuitry, logic, means, or instructions for detecting that a value of the voltage at the frequency satisfies a threshold associated with the resonance.

Some examples of the method 700 and the apparatus described herein may further include operations, features, circuitry, logic, means, or instructions for detecting that a value of the voltage at the frequency may be greater than an average value of the voltage over a set of frequencies plus a voltage offset.

Some examples of the method 700 and the apparatus described herein may further include operations, features, circuitry, logic, means, or instructions for delaying a start time of an access operation in a queue of the memory die.

Some examples of the method 700 and the apparatus described herein may further include operations, features, circuitry, logic, means, or instructions for detecting a second time, with the circuitry of the memory die, the frequency at which the monitored voltage resonates and refraining from performing an access operation to mitigate the resonance of the monitored voltage the second time.

Some examples of the method 700 and the apparatus described herein may further include operations, features, circuitry, logic, means, or instructions for altering a supply voltage used by the memory die.

Some examples of the method 700 and the apparatus described herein may further include operations, features, circuitry, logic, means, or instructions for transmitting an indication of the resonance to a host device.

In some examples of the method 700 and the apparatus described herein, the indication may include an indication that the resonance occurred, the frequency at which the monitored voltage resonated, the operation performed to mitigate the resonance, or a combination thereof.

Some examples of the method 700 and the apparatus described herein may further include operations, features, circuitry, logic, means, or instructions for performing a spectral analysis of the monitored voltage.

Some examples of the method 700 and the apparatus described herein may further include operations, features, circuitry, logic, means, or instructions for analyzing the frequency response of the monitored voltage using a fourier transform.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    monitoring a voltage of a memory die with a controller positioned on the memory die;
    analyzing, with the controller positioned on the memory die, a frequency response of the monitored voltage;
    detecting, with the controller positioned on the memory die, a frequency at which the monitored voltage resonates;
    detecting that a value of the voltage at the frequency satisfies a threshold associated with the resonance; and
    performing, with the controller positioned on the memory die, an operation to mitigate the resonance of the monitored voltage at the frequency based at least in part on the frequency response analyzed by the controller positioned on the memory die and the frequency detected by the controller positioned on the memory die, wherein the operation to mitigate the resonance further comprises delaying a start time of access operations in a command queue of the memory die.

2. The method of claim 1, wherein the voltage comprises a supply voltage of the memory die.

3. The method of claim 1, further comprising:
    detecting that a first value of the voltage at the frequency is greater than a second value of the voltage at a second frequency plus a voltage offset.

4. The method of claim 1, further comprising:
    detecting that a value of the voltage at the frequency is greater than an average value of the voltage over a set of frequencies plus a voltage offset.

5. The method of claim 1, further comprising:
    delaying a start time of an access operation in a queue of the memory die.

6. The method of claim 1, further comprising:
    detecting a second time, with the controller positioned on the memory die, the frequency at which the monitored voltage resonates; and
    refraining from performing an access operation to mitigate the resonance of the monitored voltage the second time.

7. The method of claim 1, further comprising:
    altering a supply voltage used by the memory die.

8. The method of claim 1, further comprising:
    transmitting an indication of the resonance to a host device.

9. The method of claim 8, wherein the indication comprises an indication that the resonance occurred, the frequency at which the monitored voltage resonated, the operation to perform to mitigate the resonance, or a combination thereof.

10. The method of claim 1, further comprising:
    performing a spectral analysis of the monitored voltage.

11. The method of claim 1, further comprising:
    analyzing the frequency response of the monitored voltage using a fourier transform.

12. A non-transitory computer-readable medium storing code, the code comprising instructions executable by an electronic device to:
    monitor a voltage of a memory die with a controller positioned on the memory die;
    analyze, with the controller positioned on the memory die, a frequency response of the monitored voltage;
    detect, with the controller positioned on the memory die, a frequency at which the monitored voltage resonates;
    detect, with the controller positioned on the memory die, that a value of the voltage at the frequency satisfies a threshold associated with the resonance; and
    perform an operation to mitigate the resonance of the monitored voltage based at least in part on the frequency response analyzed by the controller positioned on the memory die and the frequency detected by the controller positioned on the memory die, wherein the operation to mitigate the resonance further comprises delaying a start time of access operations in a command queue of the memory die.

13. The non-transitory computer-readable medium of claim 12, wherein the instructions are further executable by the electronic device to:
    detect that a first value of the voltage at the frequency is greater than a second value of the voltage at a second frequency plus a voltage offset.

14. The non-transitory computer-readable medium of claim 12, wherein the instructions are further executable by the electronic device to:
    detect that a value of the voltage at the frequency is greater than an average value of the voltage over a set of frequencies plus a voltage offset.

15. The non-transitory computer-readable medium of claim 12, wherein the instructions are further executable by the electronic device to:
    detect a second time the frequency at which the monitored voltage resonates; and
    refrain from performing an access operation using the memory die.

16. The non-transitory computer-readable medium of claim 12, wherein the instructions are further executable by the electronic device to:
    analyze the frequency response of the monitored voltage using a fourier transform.

17. A memory device, comprising:
    a memory die; and
    a controller positioned on the memory die wherein the controller is configured to cause the memory device to:
        monitor a voltage of the memory die with the controller positioned on the memory die;
        analyze, with the controller positioned on the memory die, a frequency response of the monitored voltage;

detect, with the controller positioned on the memory die, a frequency at which the monitored voltage resonates;

detect, with the controller positioned on the memory die, that a value of the voltage at the frequency satisfies a threshold associated with the resonance; and perform, with the controller positioned on the memory die, an operation to mitigate the resonance of the monitored voltage at the frequency based at least in part on the frequency response analyzed by the controller positioned on the memory die and the frequency detected by the controller positioned on the memory die, wherein the operation to mitigate the resonance further comprises delaying a start time of access operations in a command queue of the memory die.

18. The memory device of claim 17, wherein the controller is further configured to cause the memory device to:

detect that a first value of the voltage at the frequency is greater than a second value of the voltage at a second frequency plus a voltage offset.

19. The memory device of claim 17, wherein the controller is further configured to cause the memory device to:

detect that a value of the voltage at the frequency is greater than an average value of the voltage over a set of frequencies plus a voltage offset.

20. The memory device of claim 17, wherein the controller is further configured to cause the memory device to:

delay a start time of an access operation in a queue of the memory die.

21. The memory device of claim 17, wherein the controller is further configured to cause the memory device to:

alter a supply voltage used by the memory die.

22. The memory device of claim 17, wherein the controller is further configured to cause the memory device to:

detect a second time, with the controller of the memory die, the frequency at which the monitored voltage resonates; and refrain from performing an access operation to mitigate the resonance of the monitored voltage the second time.

* * * * *